United States Patent
Zhou et al.

(10) Patent No.: US 8,963,823 B2
(45) Date of Patent: Feb. 24, 2015

(54) LIQUID CRYSTAL DISPLAY PANEL AND GATE DRIVER CIRCUIT OF A LIQUID CRYSTAL DISPLAY PANEL INCLUDING SHIFT REGISTERS

(75) Inventors: Xiu-Feng Zhou, Guangdong (CN); Zheng-Xing Xu, Guangdong (CN)

(73) Assignee: Shenzhen China Star Optoelectronics Technologies Co., Ltd., Shenzhen (CN)

( * ) Notice: Subject to any disclaimer, the term of this patent is extended or adjusted under 35 U.S.C. 154(b) by 388 days.

(21) Appl. No.: 13/376,562

(22) PCT Filed: Oct. 31, 2011

(86) PCT No.: PCT/CN2011/081539
§ 371 (c)(1),
(2), (4) Date: Dec. 6, 2011

(87) PCT Pub. No.: WO2013/037157
PCT Pub. Date: Mar. 21, 2013

(65) Prior Publication Data
US 2013/0106826 A1 May 2, 2013

(51) Int. Cl.
*G09G 3/36* (2006.01)

(52) U.S. Cl.
CPC ....................................... *G09G 3/36* (2013.01)

USPC .......................................................... 345/100

(58) Field of Classification Search
CPC .. G09G 3/3611; G09G 3/3688; G09G 3/3677
USPC ................... 345/55, 98–100; 326/62, 63, 80; 327/333
See application file for complete search history.

(56) References Cited

U.S. PATENT DOCUMENTS

2008/0055225 A1 * 3/2008 Pak et al. ........................ 345/96

FOREIGN PATENT DOCUMENTS

TW 201044368 A1 12/2010
TW 201112211 A1 4/2011

* cited by examiner

*Primary Examiner* — Ram Mistry
(74) *Attorney, Agent, or Firm* — Mucy, Geissler, Olds & Lowe, P.C.

(57) ABSTRACT

A liquid crystal display panel comprises N gate lines, wherein N is an even number bigger two, and a first gate driver circuit which includes ((N/2)+1)th first shift registers connected in series, for outputting N gate signals to the N gate lines. The present disclosure only requires ((N/2)+1)th shift registers for outputting N gate signals to the N gate lines. Therefore, the gate driver circuit is substantially simplified, the RC distortion of inputted frequency signals (clock signals) is reduced, a board area occupied by the gate driver circuit is reduced, and the dependability of the gate driver circuit is enhanced.

11 Claims, 12 Drawing Sheets

LIQUID CRYSTAL DISPLAY PANEL AND GATE DRIVER CIRCUIT OF A LIQUID CRYSTAL DISPLAY PANEL INCLUDING SHIFT REGISTERS

FIELD OF THE INVENTION

The present invention relates to a liquid crystal display panel, and more particularly to a gate driver circuit of a liquid crystal display panel.

BACKGROUND OF THE INVENTION

Liquid crystal displays (LCD) which have advantages of low radiation, compact in size and low energy consumption, are gradually replacing conventional cathode ray tube displays, therefore they are widely used in electronic products such as laptops, personal digital assistants (PDA), flat panel televisions or mobile phones, etc. Conventional liquid crystal displays employ external driver chips to drive the pixels on the panels to display images or pictures. In order to decrease the number of components used and to reduce manufacturing costs, in the recent years, it is gradually developed to have the structures of drive circuits integrated directly on the display panels; for example, the gate on array (GOA) technology is applied to integrate gate driver circuits on a liquid crystal panel.

Referring to FIG. 1, it shows a liquid crystal display device 100 of a prior art disclosed in Taiwan patent number 201044368 employing GOA technology. The liquid crystal display device 100 comprises a source driver circuit 110, a gate driver circuit 120, a timing controller 130, a plurality of data lines DL(1) to DL(M), a plurality of gate lines GL(1) to GL(N) and a pixel matrix. The pixel matrix includes a plurality of pixel units PX, each of the pixel units PX includes a thin film transistor switch TFT, a liquid crystal capacitor $C_{LC}$ and a storage capacitor $C_{ST}$ respectively coupling with the corresponding data line and gate line, and a common voltage $V_{COM}$. The timing controller 130 produces signals required for operations of the source driver circuit 110 and the gate driver circuit 120, for examples, start pulse signals VST and frequency signals CK and XCK. The source driver circuit 110 produces corresponding data driven signals SD(1) to SD(M) for displaying images. The gate driver circuit 120 includes a plurality of shift registers SR(1) to SR(N) which are connected in series on different levels, their outputs OUT(1) to OUT(N) are correspondingly coupled with the gate lines GL(1) to GL(N), and can sequentially output gate drive signals SG(1) to SG(N) required by turning on of the thin film transistor switch TFT based on the frequency signals CK and XCK, and the start pulse signals VST. In order to provide sufficient driving capability, large-sized output thin film transistors are usually used for the shift registers SR(1) to SR(N).

Referring to FIG. 2, it shows a simplified block diagram of a liquid crystal display device 200 of a prior art disclosed in Taiwan patent number 201112211. FIG. 2 only shows a partial structure of the liquid crystal display device 200 which comprises a plurality of gate lines GL(1) to GL(N), a gate driver circuit 210 and a timing controller 220. The gate lines GL(1) to GL(N) are disposed in the display area 230 of the liquid crystal display device 200, and can correspondingly drive the pixels based on gate drive signals SG(1) to SG(N). The gate driver circuit 210 is disposed in the non-display area 240 of the liquid crystal display device 200, and includes a plurality of shift registers SR(1) to SR(N) disposed on different levels, and can output the gate drive signals SG(1) to SG(N) to the corresponding gate lines GL(1) to GL(N) based on start pulse signals VST(1), and frequency signals CK and XCK produced by the timing controller 220, and N is a positive round number. The liquid crystal display device 200 employs a structure which is arranged and driven on one end, in other words, the gate driver circuit 210 is disposed on the side of the gate lines GL(1) to GL(N), and the gate lines GL(1) to GL(N) are driven on the same side.

Referring to FIG. 3, it shows a timing diagram of the liquid crystal display device 200 of a prior art under operation. When the liquid crystal display device 200 is driven, the first level shift register SR(1) output the first level gate drive signal SG(1) based on the start pulse signal VST(1) produced by the timing controller 220, while the shift registers SR(2) to SR(N) on the second to the N level correspondingly output the gate drive signals SG(2) to SG(N) on the second to the N level, based on the start pulse signals VST(2) to VST(N) produced by the shift registers SR(1) to SR(N−1) on the previous levels. FIG. 3 shows a timing diagram of the start pulse signals VST(1) to VST(N) when the liquid crystal display device 200 shows two adjacent frames F(N) and F(N+1) amidst a few frames.

It is well known that the technology of gate on array (GOA) or gate in panel (GIP) for integrating gate driver circuits on a liquid crystal display device (TFT-LCD) panel can reduce the costs of integrated circuits, and the size of a board area around the panel; however, problems related to dependability, stability and power consumption of the complicated GOA circuits on the panel are headaches for designers. At least one shift register is required by a conventional GOA circuit to output one gate signal, therefore N shift registers are required for N gate lines for completing a loop circuit. External signal lines are also required to enter into more than N shift registers at the same time, thus problems with high power consumption and delay of signals will get more serious.

In order to reduce the RC distortion of the input signals and to enhance the dependability of the circuits, and provided that the circuits are driven properly, the GOA circuits needed to be simplified and the space occupied by the circuits needed to be reduced. Therefore it is necessary to provide a GOA circuit structure to tackle the aforementioned problems.

SUMMARY OF THE INVENTION

The present invention relates to a liquid crystal display panel, and more particularly to a gate driver circuit of a liquid crystal display panel.

The present invention provides a liquid crystal display panel, it comprises N gate lines, N is an even number bigger than two, a first gate driver circuit which includes ((N/2)+1)th first shift registers connected in series for outputting N gate signals to the N gate lines.

The present invention only requires ((N/2)+1)th shift registers for outputting N gate signals to the N gate lines. Therefore, the gate driver circuit is substantially simplified, the RC distortion of inputted frequency signals (clock signals) is reduced, the board area occupied by the gate driver circuit is reduced, and the dependability of the gate driver circuit is enhanced.

The present invention further provides a gate driver circuit, it only comprises ((N/2)+1)th shift registers connected in series for outputting N gate signals to N gate lines, N is an even number bigger than two.

The present invention will become more fully understood by reference to the following detailed description of a preferred embodiment thereof when read in conjunction with the attached drawings.

DETAILED DESCRIPTION OF THE INVENTION

Figure 1:
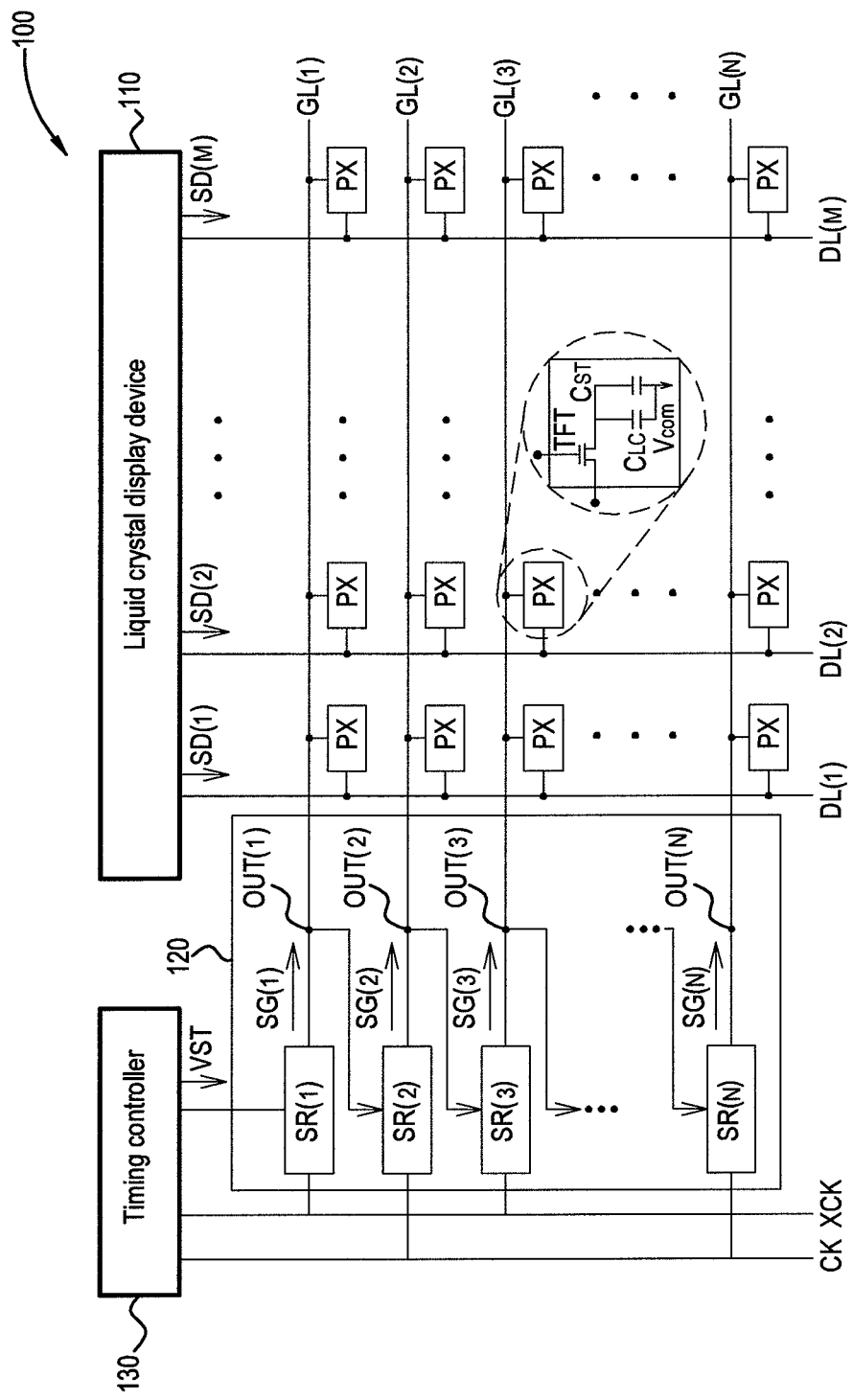
FIG. 1 is an illustration of a liquid crystal display device of a prior art employing GOA technology.
Figure 2:
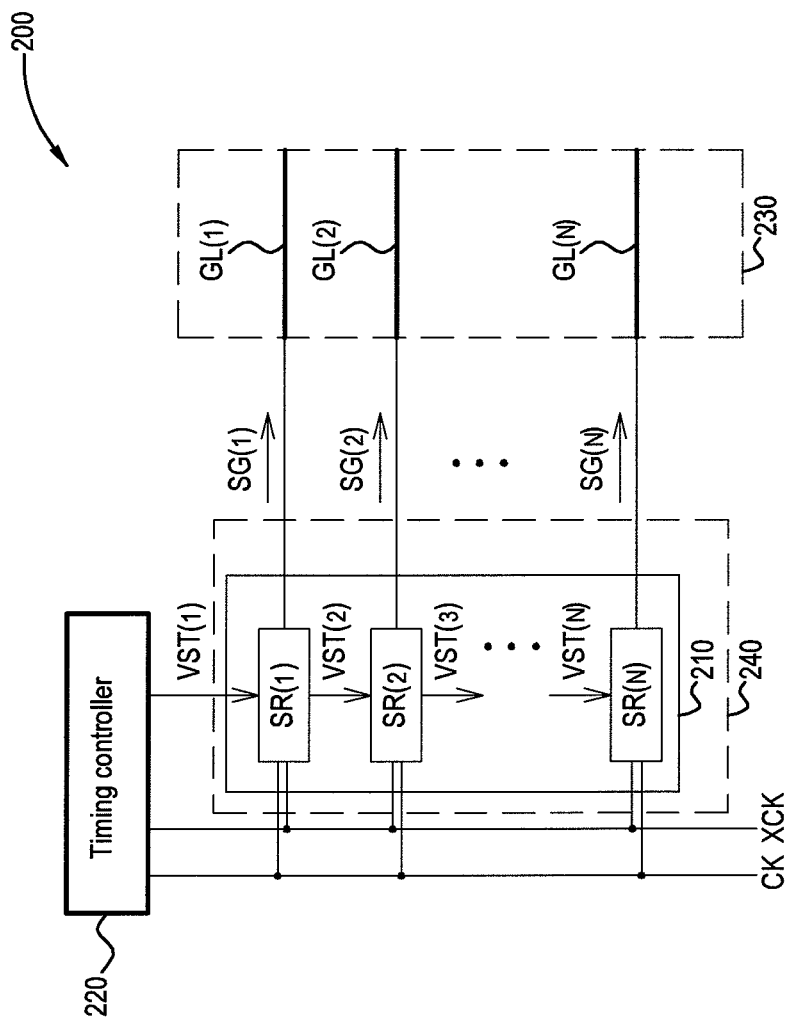
FIG. 2 is a simplified block diagram of a liquid crystal display device of a prior art.
Figure 3:
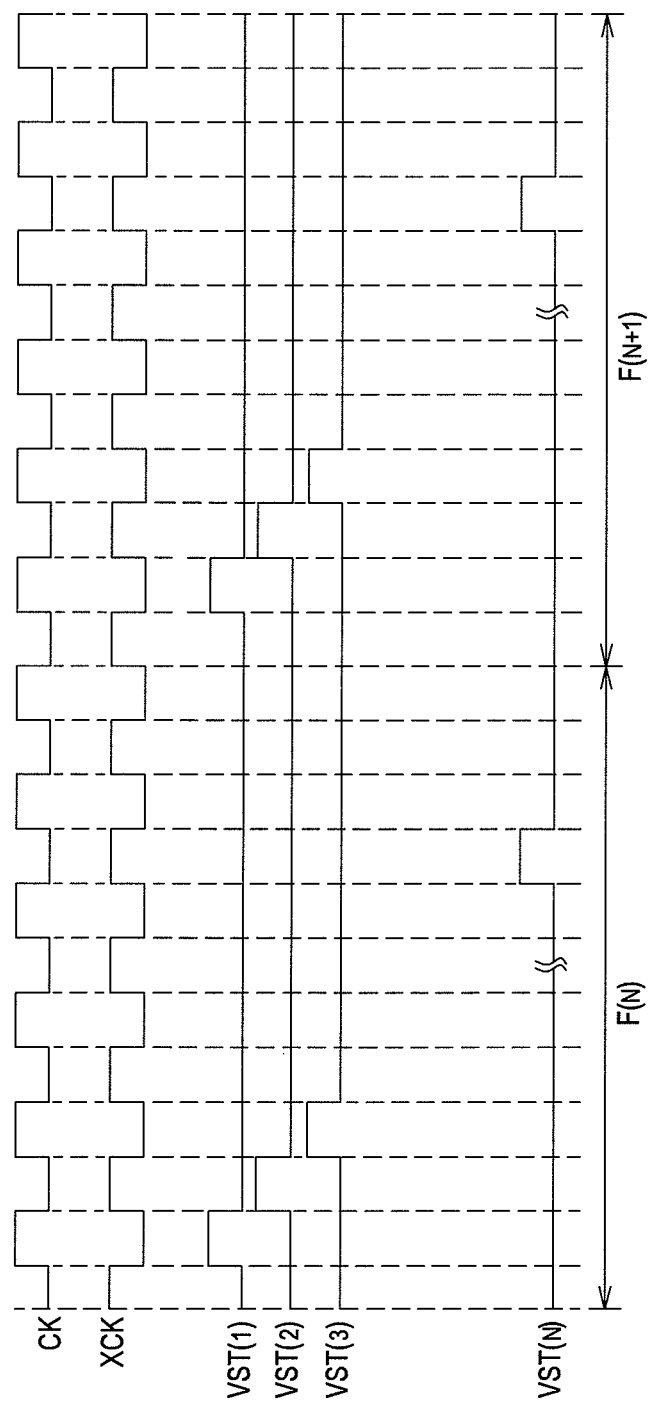
FIG. 3 is a timing diagram of a liquid crystal display device of a prior art under operation.
Figure 4:
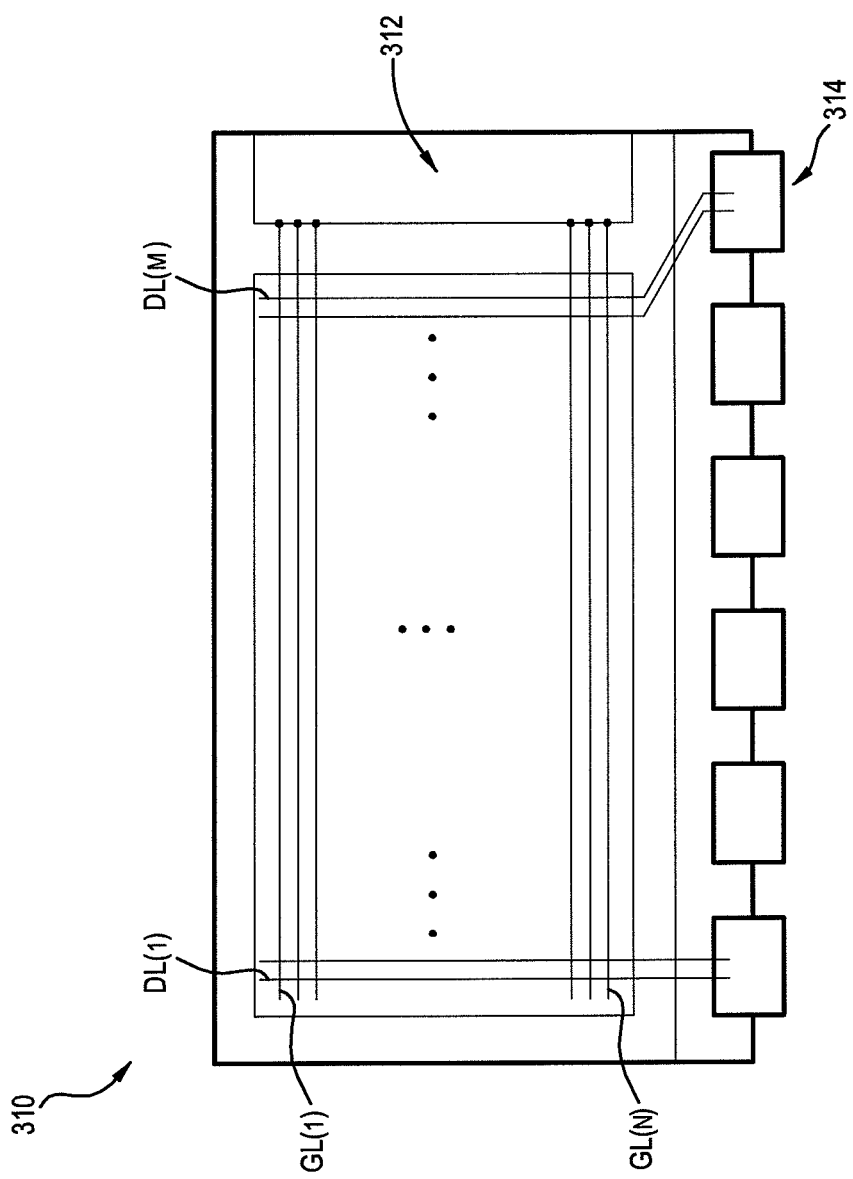
FIG. 4 is plane diagram of a liquid crystal display panel of a first embodiment of the present invention.

Referring to FIG. 4, it shows a first embodiment of a liquid crystal display panel 310 of the present invention. The liquid crystal display panel 310 comprises N gate lines (scan lines) GL(1) to GL(N) and M data lines DL(1) to DL(M). The gate lines GL(1) to GL(N) and the data lines DL(1) to DL(M) define N×M pixels, N and M are even numbers bigger than two. The gate lines GL(1) to GL(N) are electrically connected to a gate driver circuit 312, and the data lines DL(1) to DL(M) are electrically connected to a source drive circuit 314.

The liquid crystal display panel 310 comprises a plurality of pixel units arranged in an array, and each of the pixel units at least includes a gate line, a data line, a thin film transistor (TFT), a liquid crystal capacitor and a storage capacitor. The TFTs are acted as switches for the pixel units, while the gate lines and the data lines provide appropriate operational voltages for the selected pixel units, in order to have each of the pixel units correspondingly driven to display images. Furthermore, the liquid crystal capacitor is composed of a pixel electrode, a common electrode, and a liquid crystal layer disposed between the two electrodes; when a voltage is applied to the pixel electrode and the common electrode, liquid crystal molecules in the liquid crystal layer are rearranged based on the electric field direction and size, so that light is shown on the liquid crystal display panel with different brightness and contrast.

Figure 5:
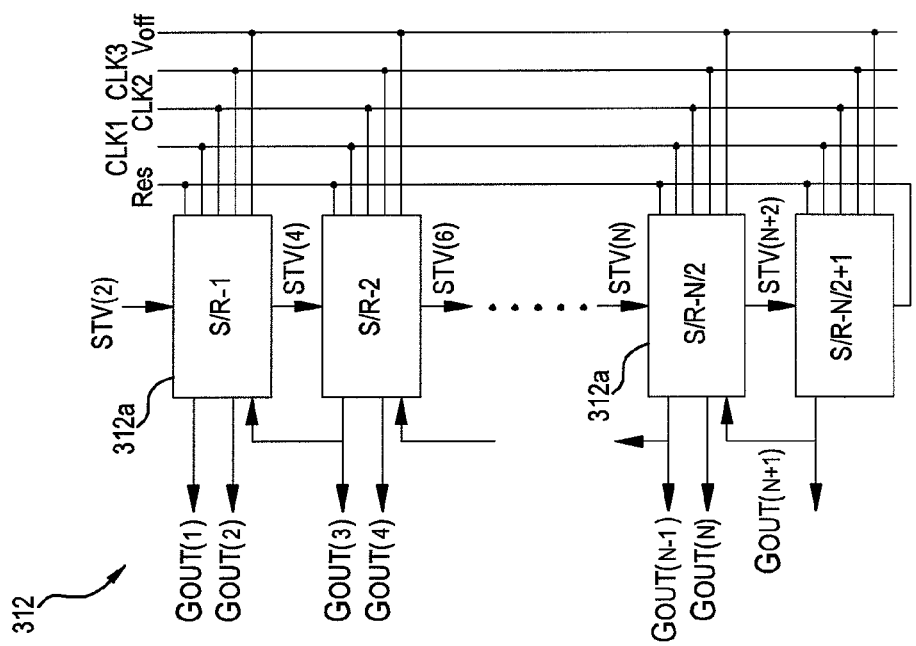
FIG. 5 is an illustration of a gate driver circuit of a first embodiment of the present invention.

Referring to FIG. 5, it shows a first embodiment of a gate driver circuit 312 of the present invention. The gate driver circuit 312 comprises ((N/2)+1)th shift registers 312a connected in series, and the shift registers 312a are used to output N gate signals Gout(1) to Gout(N) to the N gate lines GL(1) to GL(N). The present invention only requires ((N/2)+1)th shift registers 312a for outputting N gate signals Gout(1) to Gout(N) to the N gate lines GL(1) to GL(N). Therefore, the gate driver circuit is substantially simplified, the RC distortion of inputted frequency signals (clock signals) is reduced, the board area occupied by the gate driver circuit is reduced, and the dependability of the gate driver circuit is enhanced.

Figure 6:
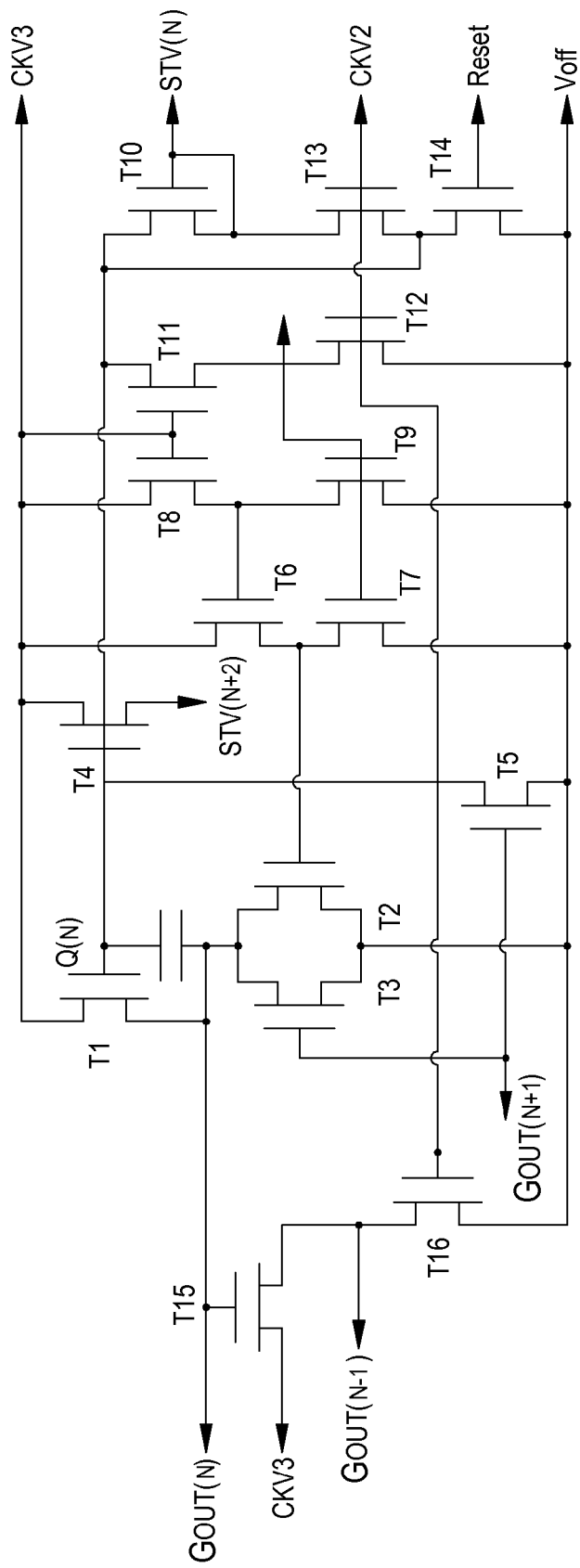
FIG. 6 is an illustration of a shift register of a first embodiment of the present invention.

Referring to FIG. 6, it shows a first embodiment of a shift register 312a of the present invention. From external, the (N/2)th shift register 312a inputs a start pulse signal STV(N), frequency signals CLK1, CLK2 and CLK3, a voltage-off signal Voff and a gate signal Gout(N+1). Via the aforementioned shift register 312a, a gate signal Gout(N), a start pulse signal STV(N+2) and a gate signal Gout(N−1) are outputted. Transistors T1 and T15 are pull-up elements for outputting gate signals Gout(N) and Gout(N−1). A transistor T4 is a carry element for outputting a start pulse signal STV(N+2). Transistors T2, T6, T7, T8, T9 and T11 are maintain-type elements for maintaining potentials required for output of the gate signals. Transistors T3, T5, T12, T13 and T16 are discharge-type elements for lowering a high potential to a low potential. A transistor T14 is a discharge and reset element. A transistor T10 provides buffering effect for input of the start pulse signals STV. More specifically, via a capacitor, a gate electrode of the transistor T1 is respectively connected to drain electrodes of the transistors T2 and T3, a source electrode of the transistor T1 and a gate electrode of the transistor T5; the gate electrode of the transistor T1 is respectively connected to a drain electrode of the transistor T5, a gate electrode of the transistor T4, a drain electrode of the transistor T11, a source electrode of the transistor T13, a drain electrode of the transistor T14 and a source electrode of the transistor T10. A drain electrode of the transistor T1 is respectively connected to drain electrodes of the transistors T4 and T6, and gate electrodes of the transistors T8 and T11. A gate electrode of the transistor T2 is connected to a gate electrode of the transistor T6. A source electrode of the transistor T2 is connected to source electrodes of the transistors T16, T5, T7, T9, T12 and T14. A gate electrode of the transistor T3 is connected to a gate electrode of the transistor T5. A gate electrode of the transistor T6 is connected to a source electrode of the transistor T8 and a drain electrode of the transistor T9. A gate electrode of the transistor T7 is connected to a gate electrode of the transistor T9, a source electrode of the transistor T11 and a drain electrode of the transistor T12. A gate electrode of the transistor T10 is connected to drain electrodes of the transistors T10 and T13. A gate electrode of the transistor T12 is connected to gate electrodes of the transistors T13 and T16. A source electrode of the transistor T15 is connected to a drain electrode of the transistor T16.

Figure 7:
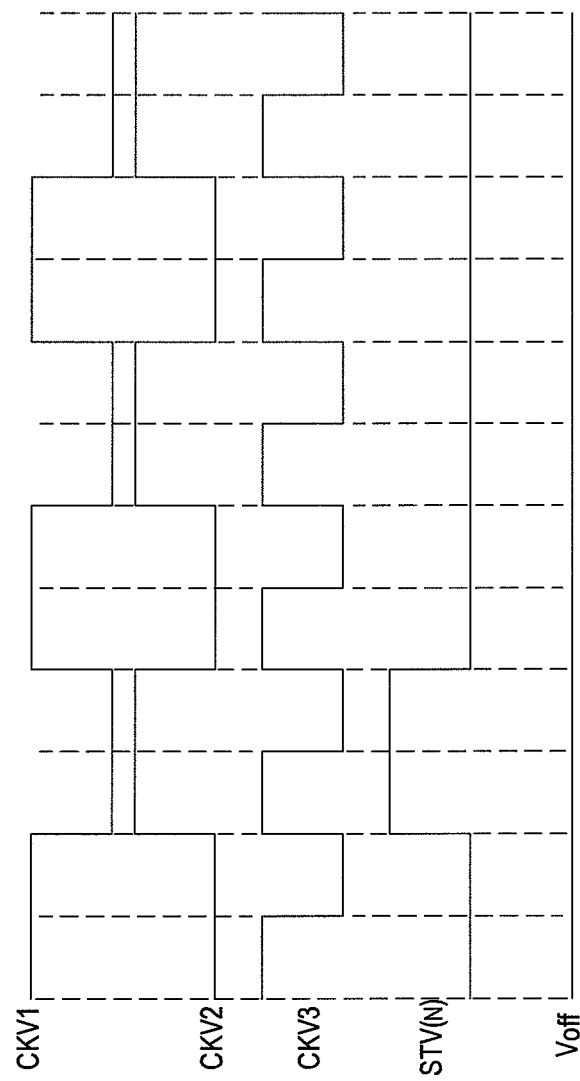
FIG. 7 is a waveform timing diagram of an input signal of a shift register of a first embodiment of the present invention.
Figure 8:
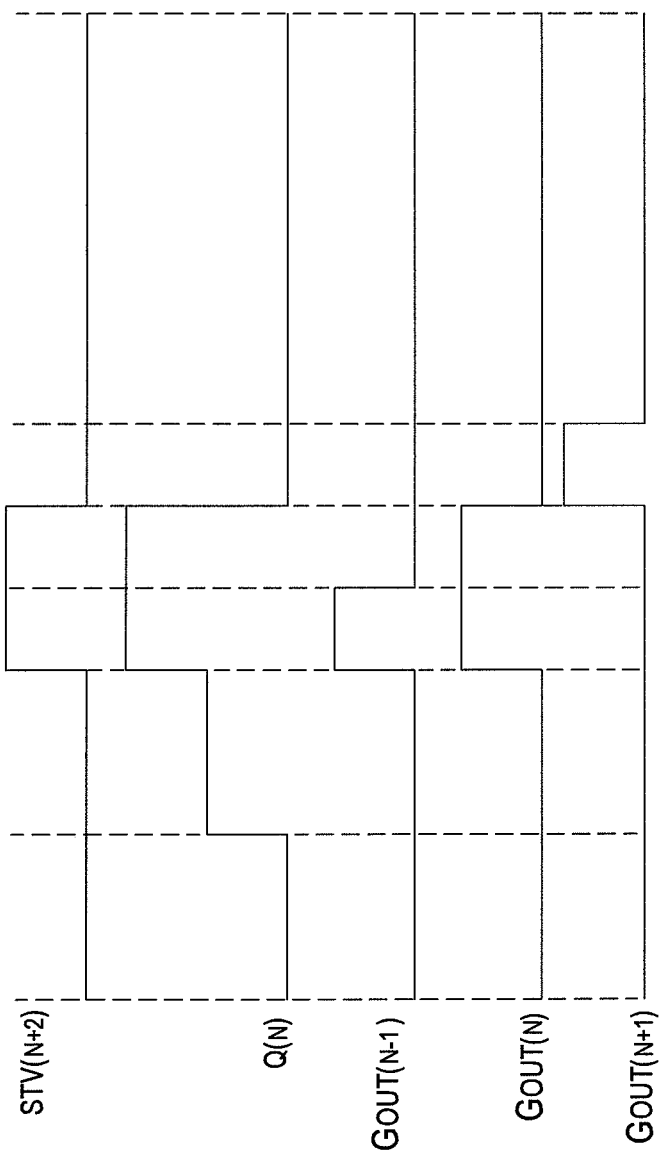
FIG. 8 is a waveform timing diagram of an output signal of a shift register of a first embodiment of the present invention.

A waveform timing diagram of an input signal of the shift register 312a is shown in FIG. 7, while a waveform timing diagram of an output signal of the shift register 312a is shown in FIG. 8. Because the number of the shift registers for inputting signals is reduced by half, thus delay effect of signals is also reduced substantially, as a result, the dependability and stability of the gate driver circuit is enhanced.

Figure 9:
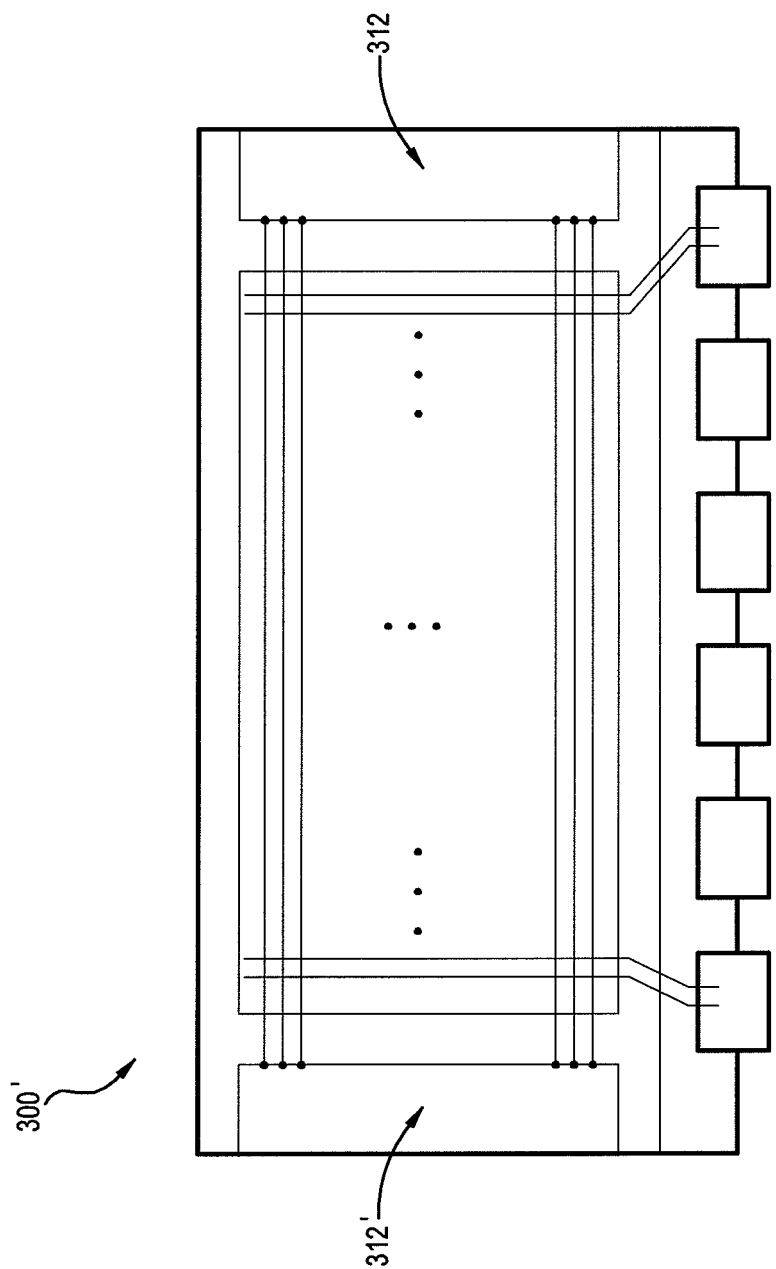
FIG. 9 is a plane diagram of a liquid crystal display panel of a second embodiment of the present invention.

Referring to FIG. 9, it shows a plane diagram of a liquid crystal display panel 310' of a second embodiment of the present invention. In general, the liquid crystal display panel 310' of the second embodiment is similar to the liquid crystal display panel 310 of the first embodiment. The differences between the liquid crystal display panel 310' of the second embodiment and the liquid crystal display panel 310 of the first embodiment lie in that, the liquid crystal display panel 310' employs dual-side driven design to enhance the charging and discharging speeds of gate driver circuits 312 and 312'. The gate driver circuit 312' on the left can be designed the same as the gate driver circuit 312 on the right, in other words, the gate driver circuit 312' also includes ((N/2)+1)th shift registers connected in series, the shift registers of the gate driver circuit 312' are in general similar to the shift registers 312a of the gate driver circuit 312, and can output N gate signals to the N gate lines to enhance the driving capability of the gate driver circuit.

Figure 10:
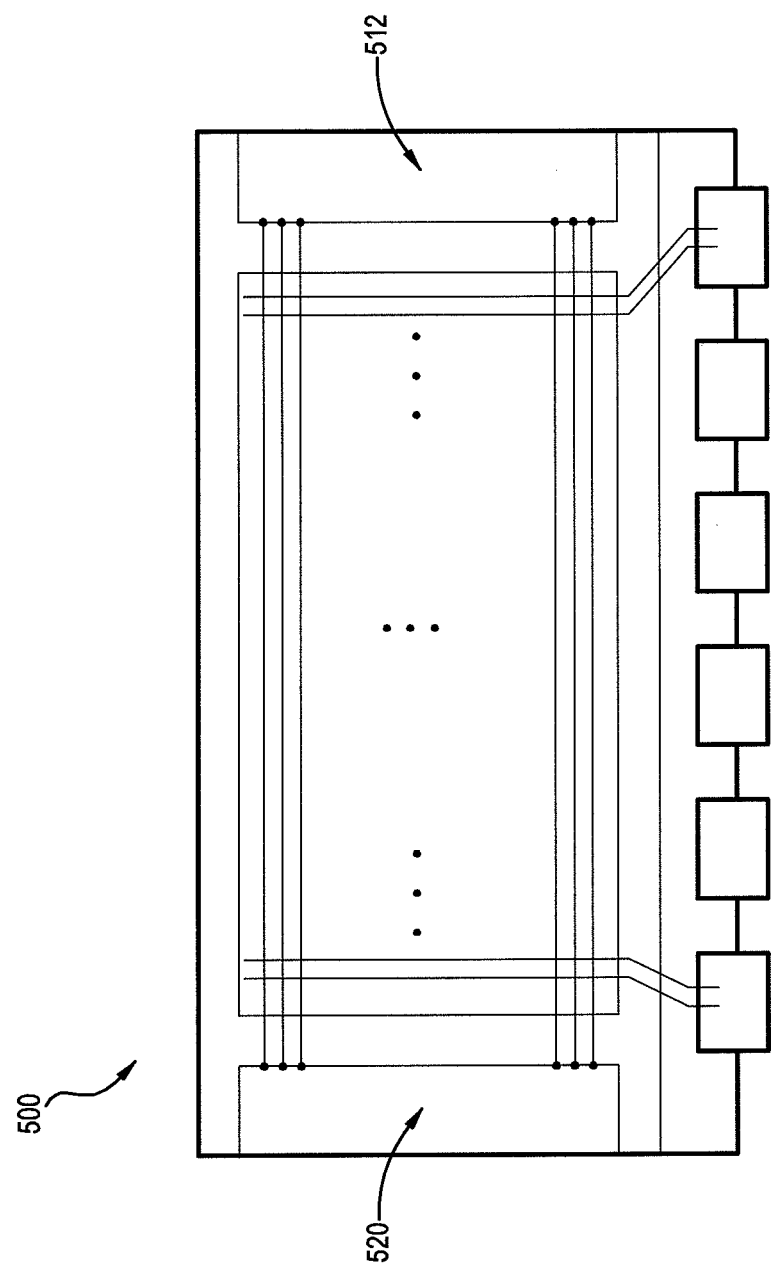
FIG. 10 is a plane diagram of a liquid crystal display panel of a third embodiment of the present invention.

FIG. 10 shows a plane diagram of a liquid crystal display panel 510 of a third embodiment of the present invention. In general, the liquid crystal display panel 510 of the third embodiment is similar to the liquid crystal display panel 310' of the second embodiment. The differences between the liquid crystal display panel 510 of the third embodiment and the liquid crystal display panel 310' of the second embodiment lie in that, only a buffer circuit 520 for charging and discharging is disposed on a left side of the liquid crystal display panel 510, in other words, a gate driver circuit 512 and the buffer circuit 520 are respectively disposed on the right and left sides of the liquid crystal display panel 510, in order to enhance the driving capability of the circuit.

Figure 11:
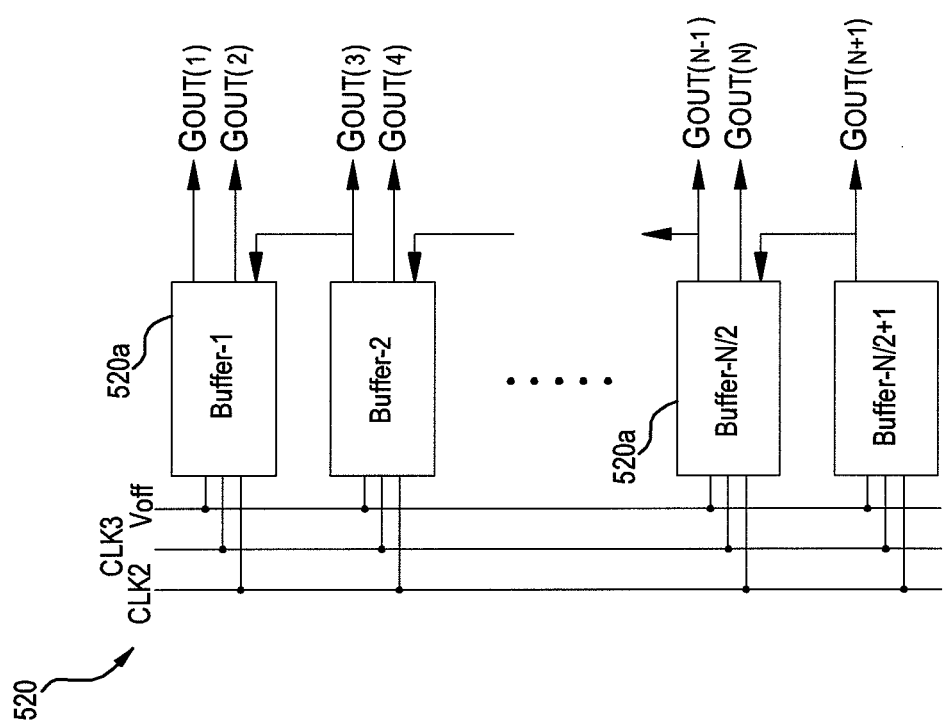
FIG. 11 is an illustration of a buffer circuit of a third embodiment of the present invention.
Figure 12:
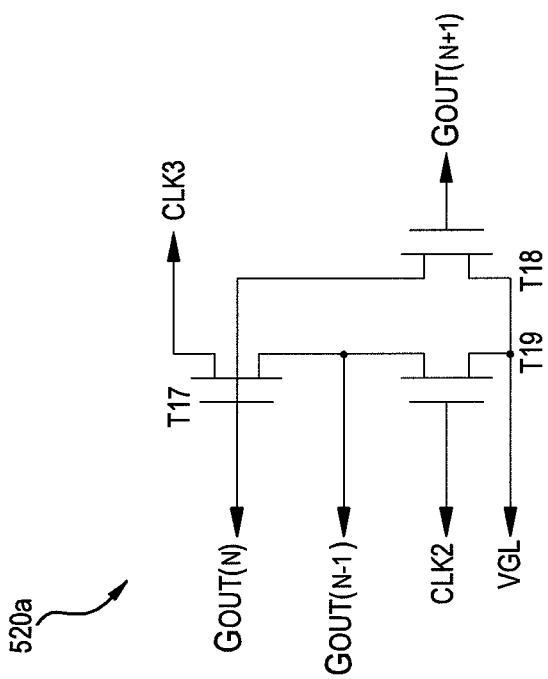
FIG. 12 is an illustration of a buffer of a third embodiment of the present invention.

FIG. 11 shows the buffer circuit 520 of the third embodiment of the present invention. Similarly, for outputting N gate signals Gout(1) to Gout(N), only ((N/2)+1)th buffers 520a which are connected in series, are required to output N gate signals to the N gate lines. Referring to FIG. 12, it shows the buffer 520a of the third embodiment of the present invention. From external, the (N/2)th buffer 520a inputs frequency signals CLK2 and CLK3, a ground voltage signal $V_{GL}$ and a gate signal Gout(N+1), a gate signal Gout(N) and a gate signal Gout(N−1) are output via the abovementioned buffer 520a. A gate signal Gout(N) and a gate signal Gout(N-1) are output via transistors T17, T18 and T19. More specifically, a gate electrode of the transistor T17 is connected to a drain electrode of the transistor T18. A source electrode of the transistor T17 is connected to a drain electrode of the transistor T19. A drain electrode of the transistor T18 is connected to a drain electrode of the transistor T19.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A gate driver circuit of a liquid crystal display panel, comprising:
(N/2)+1 first shift registers connected in series, for outputting N gate signals to N gate lines, wherein the N of the N gate lines is an even number bigger than two;
wherein the (N/2)th first shift register includes:
a first transistor and a fifteenth transistor which are pull-up elements for outputting a Nth gate signal and a (N−1)th gate signal;
a fourth transistor is a carry element for outputting a (N+2)th start pulse signal;
a second transistor, a sixth transistor, an eighth transistor and an eleventh transistor are maintain elements for maintaining potentials required for output of the gate signals;
a third transistor, a fifth transistor, a twelfth transistor, a thirteenth transistor and a sixteenth transistor are discharge elements for lowering a high potential to a low potential;
a fourteenth transistor is a discharge and reset element; and
a tenth transistor provides buffering effect for input of start pulse signals,
wherein via a capacitor, a gate electrode of the first transistor is respectively directly connected to drain electrodes of the second and the third transistors, a source electrode of the first transistor, and a gate electrode of the fifteenth transistor, the gate electrode of the first transistor is respectively directly connected to a drain electrode of the fifth transistor, a gate electrode of the fourth transistor, a drain electrode of the eleventh transistor, a source electrode of the thirteenth transistor, a drain electrode of the fourteenth transistor and a source electrode of the tenth transistor, a drain electrode of the first transistor is respectively directly connected to drain electrodes of the fourth and the sixth transistors, and gate electrodes of the eighth and the eleventh transistors, a gate electrode of the second transistor is directly connected to a gate electrode of the sixth transistor, a source electrode of the second transistor is directly connected to source electrodes of the sixteenth, the fifth, a seventh, a ninth, the twelfth and the fourteen transistors, a gate electrode of the third transistor is directly connected to a gate electrode of the fifth transistor, a gate electrode of the sixth transistor is directly connected to a source electrode of the eighth transistor and a drain electrode of the ninth transistor, a gate electrode of the seventh transistor is directly connected to a gate electrode of the ninth transistor, a source electrode of the eleventh transistor and a drain electrode of the twelfth transistor, a gate electrode of the tenth transistor is directly connected to drain electrodes of the tenth and the thirteenth transistors, a gate electrode of the twelfth transistor is directly connected to gate electrodes of the thirteenth and the sixteenth transistors, and a source electrode of the fifteenth transistor is directly connected to a drain electrode of the sixteenth transistor.

2. The gate driver circuit of a liquid crystal display panel as claimed in claim 1, wherein a Nth start pulse signal, a plurality of frequency signals, a voltage-off signal and a (N+1)th gate signal are input via the (N/2)th first shift register from external, and a Nth gate signal, a (N+2)th start pulse signal and a (N−1)th gate signal are output.

3. A liquid crystal display panel, comprising the gate driver circuit as claimed in claim 1.

4. The liquid crystal display panel as claimed in claim 3, wherein a Nth start pulse signal, a plurality of frequency signals, a voltage-off signal and a (N+1)th gate signal are input via the (N/2)th first shift register, and a Nth gate signal, a (N+2)th start pulse signal and a (N−1)th gate signal are output.

5. The liquid crystal display panel as claimed in claim 4, further comprising a second gate driver circuit comprises ((N/2)+1)th second shift registers connected in series for outputting N gate signals to the N gate lines.

6. The liquid crystal display panel as claimed in claim 5, wherein the first gate driver circuit and the second gate driver circuit are respectively disposed on a right side and a left side of the liquid crystal display panel.

7. The liquid crystal display panel as claimed in claim 5, wherein the (N/2)th second shift register inputs a Nth start pulse signal, a plurality of frequency signals, a voltage-off signal and a (N+1)th gate signal, and outputs a Nth gate signal, a (N+2)th start pulse signal and a (N−1)th gate signal.

8. The liquid crystal display panel as claimed in claim 3, further comprising a second gate driver circuit comprises ((N/2)+1)th second shift registers connected in series for outputting N gate signals to the N gate lines.

9. The liquid crystal display panel as claimed in claim 8, wherein the first gate driver circuit and the second gate driver circuit are respectively disposed on a right side and a left side of the liquid crystal display panel.

10. The liquid crystal display panel as claimed in claim 8, wherein the (N/2)th second shift register inputs a Nth start pulse signal, a plurality of frequency signals, a voltage-off signal and a (N+1)th gate signal, and outputs a Nth gate signal, a (N+2)th start pulse signal and a (N−1)th gate signal.

11. The gate driver circuit of a liquid crystal display panel as claimed in claim 10, wherein the (N/2)th second shift register includes:
- a first transistor and a fifteenth transistor which are pull-up elements for outputting a Nth gate signal and a (N−1)th gate signal;
- a fourth transistor is a carry element for outputting a (N+2)th start pulse signal;
- a second transistor, a sixth transistor, an eighth transistor and an eleventh transistor are maintain elements for maintaining potentials required for output of the gate signals;
- a third transistor, a fifth transistor, a twelfth transistor, a thirteenth transistor and a sixteenth transistor are discharge elements for lowering a high potential to a low potential;
- a fourteenth transistor is a discharge and reset element; and
- a tenth transistor provides buffering effect for input of start pulse signals,
- wherein via a capacitor, a gate electrode of the first transistor is respectively connected to drain electrodes of the second and the third transistors, a source electrode of the first transistor, and a gate electrode of the fifteenth transistor, the gate electrode of the first transistor is respectively connected to a drain electrode of the fifth transistor, a gate electrode of the fourth transistor, a drain electrode of the eleventh transistor, a source electrode of the thirteenth transistor, a drain electrode of the fourteenth transistor and a source electrode of the tenth transistor, a drain electrode of the first transistor is respectively connected to drain electrodes of the fourth and the sixth transistors, and gate electrodes of the eighth and the eleventh transistors, a gate electrode of the second transistor is connected to a gate electrode of the sixth transistor, a source electrode of the second transistor is connected to source electrodes of the sixteenth, the fifth, a seventh, a ninth, the twelfth and the fourteen transistors, a gate electrode of the third transistor is connected to a gate electrode of the fifth transistor, a gate electrode of the sixth transistor is connected to a source electrode of the eighth transistor and a drain electrode of the ninth transistor, a gate electrode of the seventh transistor is connected to a gate electrode of the ninth transistor, a source electrode of the eleventh transistor and a drain electrode of the twelfth transistor, a gate electrode of the tenth transistor is connected to drain electrodes of the tenth and the thirteenth transistors, a gate electrode of the twelfth transistor is connected to gate electrodes of the thirteenth and the sixteenth transistors, and a source electrode of the fifteenth transistor is connected to a drain electrode of the sixteenth transistor.

* * * * *